US012707869B2

(12) United States Patent
Kim et al.

(10) Patent No.: US 12,707,869 B2
(45) Date of Patent: Aug. 11, 2026

(54) DISPLAY INCLUDING POLARIZING AND RETARDATION STRUCTURE

(71) Applicant: Samsung Display Co., Ltd., Yongin-si (KR)

(72) Inventors: Ji-Hoon Kim, Hwaseong-si (KR); Eunmi Seo, Cheonan-si (KR); Minju Oh, Suwon-si (KR); Heeyoung Lee, Hwaseong-si (KR); Minkyoung Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 604 days.

(21) Appl. No.: 18/076,531

(22) Filed: Dec. 7, 2022

(65) Prior Publication Data

US 2023/0217698 A1 Jul. 6, 2023

(30) Foreign Application Priority Data

Jan. 3, 2022 (KR) ........................ 10-2022-0000561

(51) Int. Cl.

| | |
|---|---|
| ***H10K 59/80*** | (2023.01) |
| ***G02B 5/30*** | (2006.01) |
| ***H10K 50/80*** | (2023.01) |
| ***H10K 59/40*** | (2023.01) |
| ***H10K 59/65*** | (2023.01) |
| ***H10K 77/10*** | (2023.01) |
| ***H10K 102/00*** | (2023.01) |

(52) U.S. Cl.

CPC ....... *H10K 59/8791* (2023.02); *G02B 5/3083* (2013.01); *H10K 50/868* (2023.02); *H10K 59/40* (2023.02); *H10K 59/65* (2023.02); *H10K 59/8793* (2023.02); *H10K 77/111* (2023.02); *H10K 2102/311* (2023.02)

(58) Field of Classification Search

CPC .. H10K 50/86; H10K 59/8791; H10K 77/111; H10K 2102/311; H10K 50/868; H10K 59/8793; H10K 59/40; H10K 59/65; G02B 5/3083

See application file for complete search history.

(56) References Cited

U.S. PATENT DOCUMENTS

| | | | |
|---|---|---|---|
| 9,081,144 | B2 | 7/2015 | Cho et al. |
| 10,401,675 | B2 | 9/2019 | Lee et al. |
| 10,571,957 | B2 | 2/2020 | Mathew et al. |
| 11,660,845 | B2 | 5/2023 | Cho et al. |

(Continued)

FOREIGN PATENT DOCUMENTS

| | | |
|---|---|---|
| CN | 111999791 | 11/2020 |
| KR | 10-1525998 | 6/2015 |

(Continued)

*Primary Examiner* — Aaron J Gray

(74) *Attorney, Agent, or Firm* — Innovation Counsel LLP

(57) ABSTRACT

An electronic device includes an electronic module, a display module including into a first display region overlapping the electronic module in a plan view and a second display region not overlapping the electronic module in the plan view, a polarizing plate disposed on the display module, and an upper module disposed on the polarizing plate, having an in-plane retardation value in a range of about 50 nm to about 60 nm, and having a thickness-direction retardation value in a range of about 50 nm to about 150 nm.

13 Claims, 11 Drawing Sheets

(56) References Cited

U.S. PATENT DOCUMENTS

| | | | | |
|---|---|---|---|---|
| 2011/0234079 | A1* | 9/2011 | Eom | G02B 5/3083 313/112 |
| 2012/0003402 | A1* | 1/2012 | Ohashi | G02B 1/04 536/63 |
| 2018/0067574 | A1* | 3/2018 | Masumoto | G02F 1/1333 |
| 2020/0259124 | A1 | 8/2020 | Kim et al. | |
| 2021/0013276 | A1* | 1/2021 | Kim | G02B 5/3083 |
| 2021/0311238 | A1* | 10/2021 | Lee | G02F 1/133638 |

FOREIGN PATENT DOCUMENTS

| | | | |
|---|---|---|---|
| KR | 10-2018-0061484 | A | 6/2018 |
| KR | 10-2019-0120925 | A | 10/2019 |
| KR | 10-2020-0098751 | | 8/2020 |
| KR | 10-2021-0104514 | A | 8/2021 |
| KR | 10-2021-0109100 | A | 9/2021 |
| KR | 10-2021-0123461 | A | 10/2021 |

* cited by examiner

FIG. 4

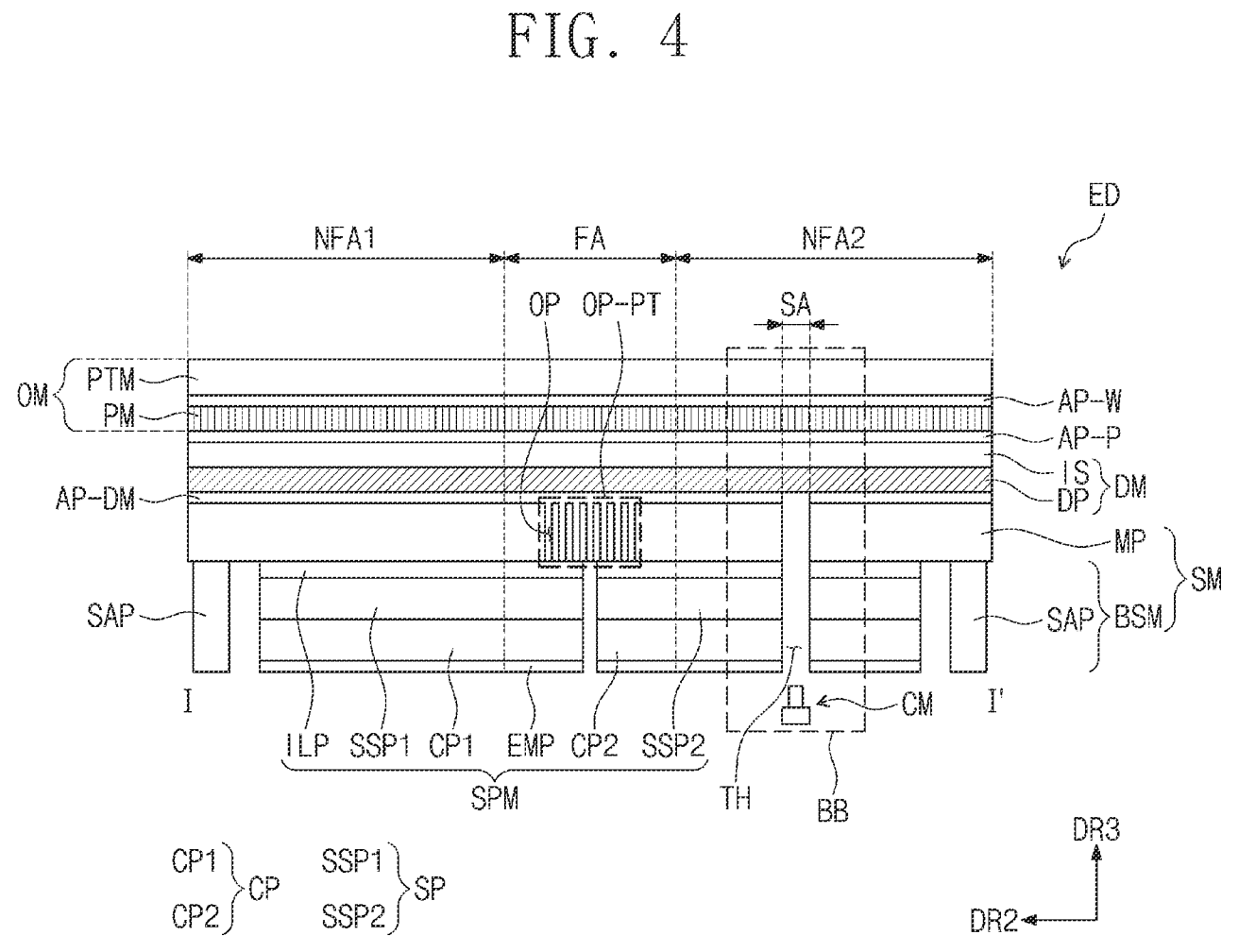

ED
NFA1 FA NFA2
OP OP-PT
SA
AP-W
AP-P
IS
DP
DM
MP
SAP
BSM
SM
DR3
DR2
I'
CM
BB
TH
SSP2
CP2
EMP
CP1
SSP1
ILP
SPM
SSP1
SSP2
SP
CP1
CP2
CP
I
SAP
AP-DM
PTM
PM
OM

DISPLAY INCLUDING POLARIZING AND RETARDATION STRUCTURE

CROSS-REFERENCE TO RELATED APPLICATIONS

This application claims priority to and benefits of Korean Patent Application No. 10-2022-0000561 under 35 U.S.C. § 119, filed on Jan. 3, 2022, the entire contents of which are incorporated herein by reference.

BACKGROUND

1. Technical Field

The disclosure herein relates to an electronic device, and, to an electronic device including a camera module on a lower portion of a display module.

2. Description of the Related Art

Various types of electronic devices are used to provide image information, and an electronic device may include an electronic module for receiving an external signal, or providing an output signal to the outside. For example, the electronic module may include a camera module, and the demand for an electronic device capable of obtaining captured images with high image quality is increasing.

In order to increase a region in which an image is displayed in an electronic device, providing a camera module or the like in a region in which an image is displayed is being considered, and accordingly, there is a need to improve the quality of a captured image captured through a display region while maintaining the display quality in the display region in which the camera module is disposed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic device with improved sensing performance of an electronic module disposed in a lower portion of a display module.

The disclosure also provides an electronic device with improved display quality of an image captured using a camera module disposed in a lower portion of a display module.

An embodiment of the disclosure may include an electronic device including an electronic module; a display module including a first display region overlapping the electronic module in a plan view and a second display region not overlapping the electronic module in the plan view; a polarizing plate disposed on the display module; and an upper module disposed on the polarizing plate, having an in-plane retardation value in a range of about 50 nm to about 60 nm, and having a thickness-direction retardation value in a range of about 50 nm to about 150 nm.

In an embodiment, the upper module may include a window disposed on an upper side of the polarizing plate, and a protective layer disposed on the window, the protective layer may have an in-plane retardation value in a range of about 50 nm to about 60 nm, and a thickness-direction retardation value in a range of about 50 nm to about 150 nm.

In an embodiment, the protective layer may be a biaxially stretched polymer film.

In an embodiment, the protective layer may include polyethylene terephthalate (PET), polycarbonate (PC), polymethyl methacrylate (PMMA), polystyrene (PS), or triacetyl cellulose (TAC).

In an embodiment, the polarizing plate may include a linear polarizing layer, wherein a transmission axis of the linear polarizing layer and a slow axis of the protective layer may be parallel.

In an embodiment, the window may be a tempered glass substrate.

In an embodiment, the upper module may include an upper film layer disposed between the polarizing plate and the window, the upper film layer may have an in-plane retardation value in a range of about 50 nm to about 60 nm, and a thickness-direction retardation value in a range of about 50 nm to about 150 nm.

In an embodiment, the upper film layer may be a biaxially stretched polymer film.

In an embodiment, the upper film layer may include polyethylene terephthalate (PET), polycarbonate (PC), polymethyl methacrylate (PMMA), polystyrene (PS), or triacetyl cellulose (TAC).

In an embodiment, the polarizing plate may include a linear polarizing layer, a transmission axis of the linear polarizing layer and a slow axis of the upper film layer may be parallel.

In an embodiment, the polarizing plate may include a linear polarizing layer, and at least one polarizing protective layer disposed on the linear polarizing layer, the at least one polarizing protective layer may have an in-plane retardation value in a range of about 50 nm to about 60 nm, and a thickness-direction retardation value in a range of about 50 nm to about 150 nm.

In an embodiment, the polarizing plate may include a $\lambda/4$ phase retardation layer disposed between the display module and the linear polarizing layer.

In an embodiment, the electronic module may be a camera module with an optical path disposed in a direction of the display module.

In an embodiment, the display module may include a display panel including a light emitting element layer, and an input sensor directly disposed on the display panel.

In an embodiment of the disclosure, an electronic device may include a display module; a camera module disposed on a lower side of the display module that captures an image in a front surface direction of the display module; a polarizing plate disposed on an upper side of the display module; and an upper module including at least one polymer film layer disposed on an upper side of the polarizing plate, having an in-plane retardation value in a range of about 50 nm to about 60 nm, and having a thickness-direction retardation value in a range of about 50 nm to about 150 nm.

In an embodiment, the upper module may include an upper film layer disposed on an upper side of the polarizing plate; a window disposed on an upper side of the upper film layer; and a protective layer disposed on an upper side of the window, and the upper film layer and the protective layer may each be the polymer film layer.

In an embodiment, the upper film layer and the protective layer may each be a biaxially stretched polymer film.

In an embodiment of the disclosure, an electronic device may include an electronic module; a display module including a first display region overlapping the electronic module in a plan view and a second display region not overlapping the electronic module in the plan view; and an optical member disposed on the display module, wherein the optical member may include at least one biaxially stretched polymer film, and the entire optical member has an in-plane retardation value in a range of about 50 nm to about 60 nm, and a thickness-direction retardation value in a range of about 50 nm to about 150 nm.

In an embodiment, the optical member may include a polarizing plate including a linear polarizing layer and a polarizing protective layer disposed on each of an upper side and a lower side of the linear polarizing layer; a window disposed in an upper portion of the polarizing plate; and a protective layer disposed on the window, and the polarizing protective layer and the protective layer may each be the biaxially stretched polymer film.

In an embodiment, the optical member may include an upper film layer disposed between the polarizing plate and the window, and the upper film layer may be the biaxially stretched polymer film.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 4 is a schematic cross-sectional view of an electronic device according to an embodiment;

DETAILED DESCRIPTION OF THE EMBODIMENTS

Figure 1:
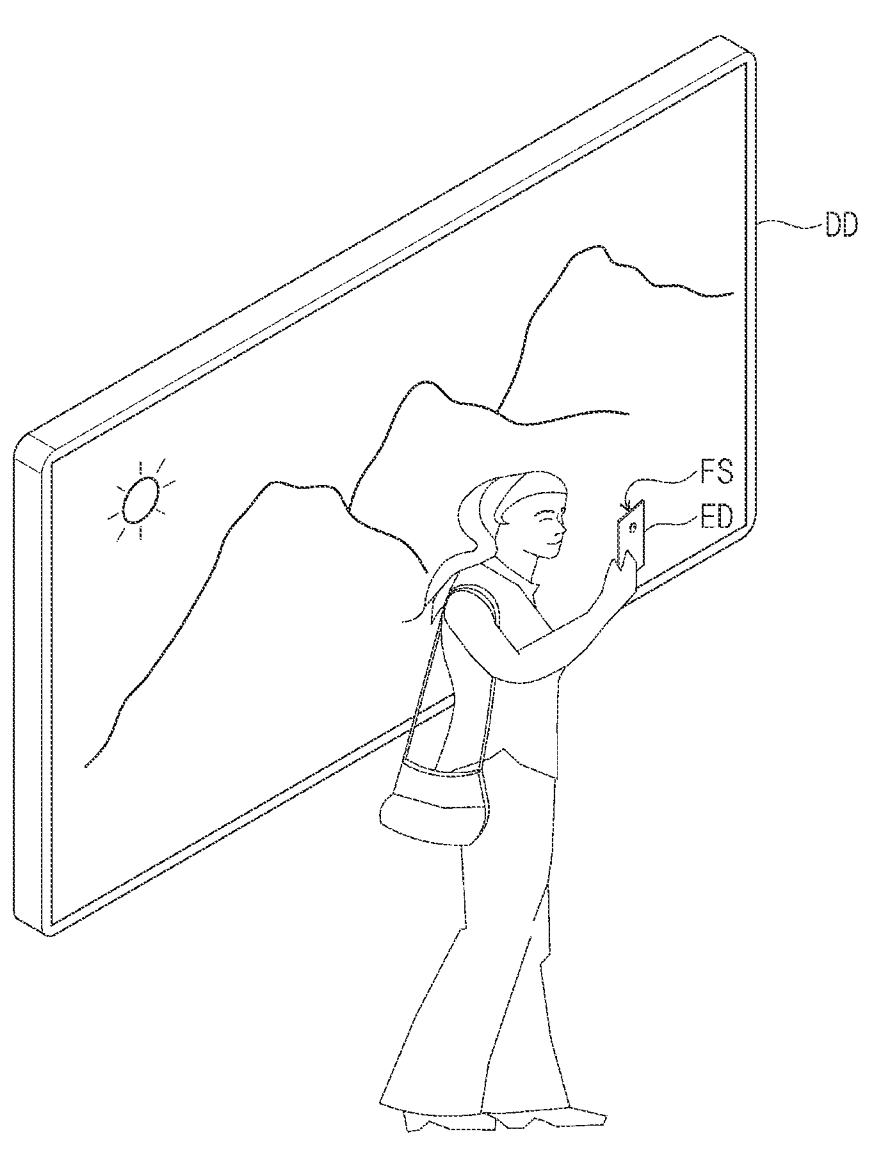
FIG. 1 is a view showing one example of use of using an electronic device of an embodiment.

The disclosure may be modified in many alternate forms, and thus embodiments will be illustrated in the drawings and described in detail. It should be understood, however, that it is not intended to limit the disclosure to the forms disclosed, but rather, is intended to cover all modifications, equivalents, and alternatives falling within the spirit and scope of the disclosure.

In the disclosure, in case that an element (or a region, a layer, a portion, and the like) is referred to as being "on," "connected to," or "coupled to" another element, it means that the element may be directly disposed on/connected to/coupled to the other element, or that a third element or other elements may be disposed therebetween.

It will be understood that the terms "connected to" or "coupled to" may include a physical or electrical connection or coupling.

In the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

Like reference numerals refer to like elements. Also, in the drawings, the thickness, the ratio, and the dimensions of elements may be exaggerated for an effective description of technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of the disclosure.

The terms of a singular form may include plural forms unless the context clearly indicates otherwise. For example, as used herein, the singular forms, "a," "an," and "the" are intended to include the plural forms as well, unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings. In the disclosure, being "disposed on" may not only include the case of being disposed in an upper portion of any one member but also the case of being disposed in a lower portion thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other.

It should be understood that the terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in an ideal a sense or an overly formal sense unless explicitly defined herein.

Hereinafter, an electronic device according to an embodiment of the disclosure will be described with reference to the accompanying drawings.

Figure 2A:
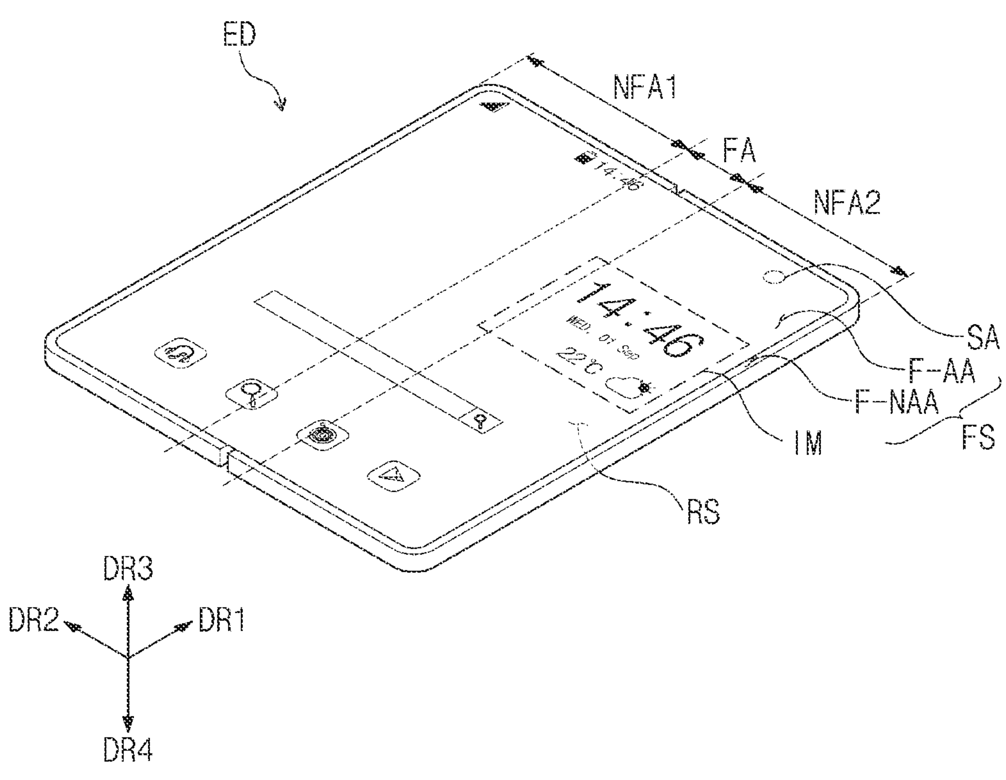
FIG. 2A is a schematic perspective view showing an electronic device according to an embodiment in an unfolded state.
Figure 2B:
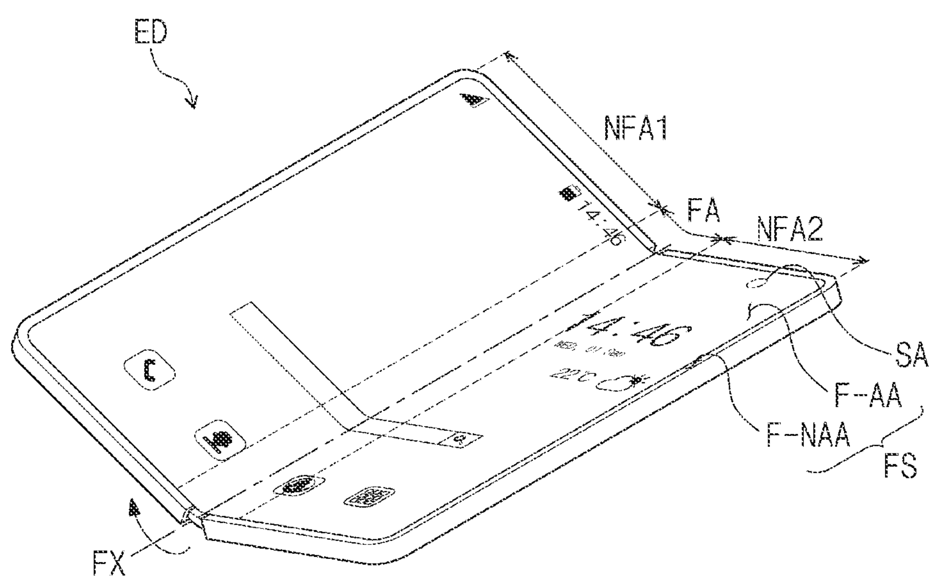
FIG. 2B is a schematic perspective view showing an inner-folding process of an electronic device of an embodiment.
Figure 2B:
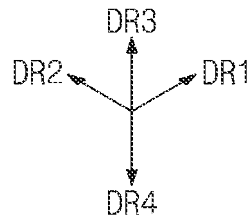
Figure 2C:
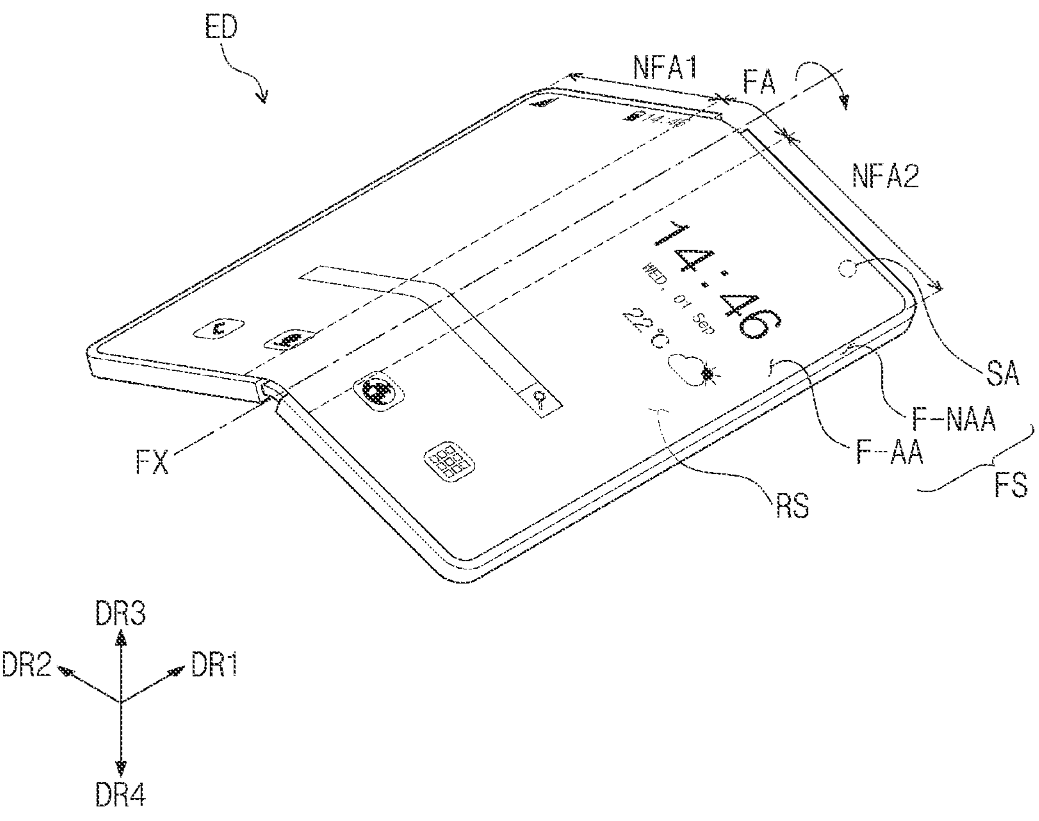
FIG. 2C is a schematic perspective view showing an outer-folding process of an electronic device of an embodiment.

FIG. 1 is a view showing one example of use of using an electronic device according to an embodiment. FIG. 2A to FIG. 2C are schematic perspective views of an electronic device according to an embodiment. FIG. 2A is a schematic perspective view showing an electronic device according to an embodiment in an unfolded state. FIG. 2B is a perspective view showing an inner-folding process of the electronic device illustrated in FIG. 2A. FIG. 2C is a schematic perspective view showing an outer-folding process of the electronic device illustrated in FIG. 2A.

FIG. 1 is a view showing an example of use of using an electronic device ED according to an embodiment, and FIG. 1 shows an example of use of using the electronic device ED to capture an image in a selfie mode. FIG. 1 shows an example of use of using the electronic device ED of an embodiment to capture an image in front of a display device DD, and shows an example of use of capturing an image such that a display surface FS of the electronic device ED is toward the display device DD.

In the example of use illustrated in FIG. 1 and the like, the display device DD may be a large electronic device such as a television, a monitor, or an external advertisement board. Also, the electronic device ED may be a small and medium-sized electronic device such as a smart phone, a personal computer, a laptop computer, a personal digital terminal, a car navigation system unit, and a game console. The examples of the display device DD and the electronic device ED listed above are example embodiments, and other electronic devices may be employed without departing from the disclosure. For example, a small-and-medium-sized electronic device such as a smart phone, a personal computer, a laptop computer, a personal digital terminal, a car navigation system, and a game console may be used as the display device DD.

As illustrated in FIG. 1, in case that an image is captured in a selfie mode, the image quality of the image captured may be degraded due to an optical interference phenomenon in functional layers (protective layer, impact absorbing layer, polarizing plate, for example) of an optical member disposed on a front surface of an electronic module CM (see FIG. 3) and included in the electronic device ED and optical functional layers (polarizing plate, for example) included in the display device DD. For example, due to an optical interference phenomenon in the functional layers included in the electronic device ED and optical functional layers included in the display device DD, an image quality degradation phenomenon referred to as Rainbow mura may occur.

The example of use of the electronic device ED of an embodiment illustrated in FIG. 1 is an example, and in case that an image is captured using the electronic module CM (see FIG. 3) toward the display surface FS in the electronic device ED, problems such as capturing quality degradation may occur. The electronic device ED of an embodiment to be described below may improve capturing quality by controlling a retardation value in an optical member disposed in an upper portion of a display module in case that an image is captured using the electronic module CM (see FIG. 3) toward the display surface FS.

The electronic device ED of an embodiment may be a device activated according to an electrical signal. In the disclosure of the disclosure, FIG. 2A and the like illustrate the electronic device ED as a mobile phone.

In FIG. 2A to FIG. 2C, the electronic device ED is illustrated as a foldable electronic device transformed into a folded form, but the embodiment of the disclosure is not limited thereto. The electronic device ED of an embodiment may be a flexible electronic device which may be bent or rolled to be transformed in shape.

In FIG. 2A and the following drawings, a first direction axis DR1 to a fourth direction axis DR4 are illustrated. Directions indicated by the first to fourth direction axes DR1, DR2, DR3, and DR4 described in the disclosure are relative concepts, and may be converted to different directions. The directions indicated by the first to fourth direction axes DR1, DR2, DR3, and DR4 may be described as first to third directions, and may be denoted by the same reference numerals.

Referring to FIG. 2A to FIG. 2C, the electronic device ED according to an embodiment may include the display surface FS defined by the first direction axis DR1 and the second direction axis DR2 intersecting the first direction axis DR1. The electronic device ED may provide an image IM to a user through the display surface FS. The electronic device ED of an embodiment may display the image IM toward a third direction axis DR3 direction on the display surface FS which is parallel to each of the first direction axis DR1 and the second direction axis DR2. In the disclosure, a front surface (or an upper surface) and a rear surface (or a lower surface) of each component are defined on the basis of a direction in which the image IM is displayed. In the disclosure, the direction in which the image IM is displayed may be defined as the third direction axis DR3 direction, and a fourth direction axis DR4 direction may be defined as a direction opposing the third direction axis DR3 direction.

The electronic device ED according to an embodiment may sense an external input applied from the outside. The external input may include various forms of inputs provided from the outside of the electronic device ED. For example, the external input may include not only a contact by a part of a user's body, such as a hand, but also an external input applied in close proximity, or adjacent to the electronic device ED at a distance (for example, hovering). Also, the external input may have various forms such as force, pressure, temperature, light, and the like within the spirit and the scope of the disclosure.

The display surface FS of the electronic device ED may include an active region F-AA and a peripheral region F-NAA. The active region F-AA may be a region activated according to an electrical signal. The electronic device ED according to an embodiment may display the image IM through the active region F-AA. Various forms of external inputs may be sensed in the active region F-AA. The peripheral region F-NAA is adjacent to the active region F-AA. The peripheral region F-NAA may have a color. The peripheral region F-NAA may surround the active region F-AA. Accordingly, the shape of the active region F-AA may substantially be defined by the peripheral region F-NAA. However, this is only an illustrated example. The peripheral region F-NAA may be disposed adjacent to only one side or a side of the active region F-AA, or may be omitted. The electronic device ED according to an embodiment of the disclosure may include an active region in various shapes, and is not limited to any one embodiment.

The active region F-AA may include a sensing region SA. The sensing region SA may have various electronic modules disposed therein. For example, an electronic module may include at least one of a camera module, a speaker, a light sensing sensor, or a heat sensing sensor. The sensing region SA may sense an external object received through the display surface FS, or may provide a sound signal such as voice to the outside through the display surface FS. The electronic module may include a plurality of components, and is not limited to any one embodiment.

The sensing region SA may be surrounded by the active region F-AA and the peripheral region F-NAA. However, the embodiment of the disclosure is not limited thereto. The sensing region SA may be disposed in the active region F-AA, and is not limited to any one embodiment. FIG. 2A and the like illustrate one sensing region SA, but the number of the sensing region SA is not limited thereto.

The sensing region SA may be a portion of the active region F-AA. Therefore, the electronic device ED may also display an image in the sensing region SA. In case that electronic modules disposed in the sensing region SA are deactivated, the sensing region SA may display a video or an image as a display surface.

A rear surface RS of the electronic device ED of an embodiment may be a surface facing the display surface FS. In an embodiment, the rear surface RS may be an external surface of the electronic device ED, and may not have an image or an image displayed thereon. However, the embodiment of the disclosure is not limited thereto, and the rear surface RS may function as a second display surface on which an image or an image is displayed. The electronic device ED of an embodiment may further include a sensing region disposed on the rear surface RS. The sensing region disposed on the rear surface RS may also include a camera, a speaker, a light sensing sensor, and the like disposed therein.

The electronic device ED may include a folding region FA and non-folding regions NFA1 and NFA2. The electronic device ED may include non-folding regions NFA1 and NFA2. The electronic device ED of an embodiment may include a first non-folding region NFA1 and a second non-folding region NFA2 disposed with the folding region FA interposed therebetween. FIG. 2A to FIG. 2C illustrate an embodiment of the electronic device ED including one folding region FA, but the embodiment is not limited thereto, and the electronic device ED may have folding regions defined therein. However, the embodiment of the disclosure is not limited thereto, and the electronic device ED of an embodiment may be folded on the basis of folding axes such that portions of the display surface FS may be folded to face each other, and the number of folding axes and the number of non-folding regions accordingly are not particularly limited.

Referring to FIG. 2B and FIG. 2C, the electronic device ED according to an embodiment may be folded on the basis of a folding axis FX. The folding axis FX illustrated in FIG. 2B and FIG. 2C is a virtual axis extended in a first direction axis DR1 direction, and the folding axis FX may be parallel to a long side direction of the electronic device ED. However, the embodiment of the disclosure is not limited thereto, and an extension direction of the folding axis FX is not limited to the first direction axis DR1 direction.

The folding axis FX may be extended along the first direction axis DR1 on the display surface FS, or may be extended along the first direction axis DR1 on a lower portion of the rear surface RS. Referring to FIG. 2B, in an embodiment, the first non-folding region NFA1 and the second non-folding region NFA2 may face each other, and the electronic device ED may be inner-folded such that the display surface FS is not exposed to the outside. Referring to FIG. 2C, the electronic device ED according to an embodiment may be folded on the basis of the folding axis FX and transformed into an outer-folded state in which, in the rear surface RS, one region or a region overlapping the first non-folding region NFA1 and the other region overlapping the second non-folding region NFA2 face each other.

Figure 3:
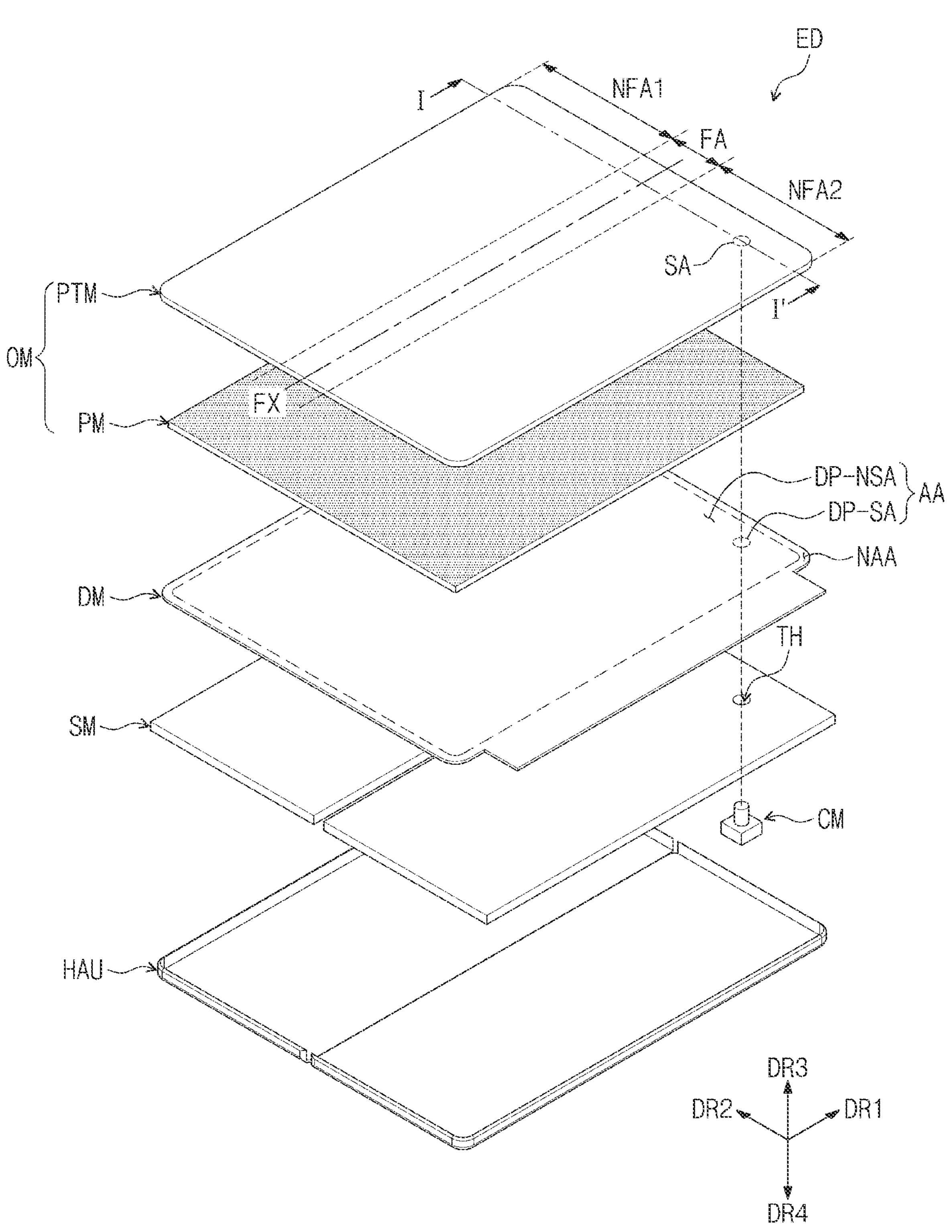
FIG. 3 is an exploded schematic perspective view of an electronic device according to an embodiment.
Figure 5:
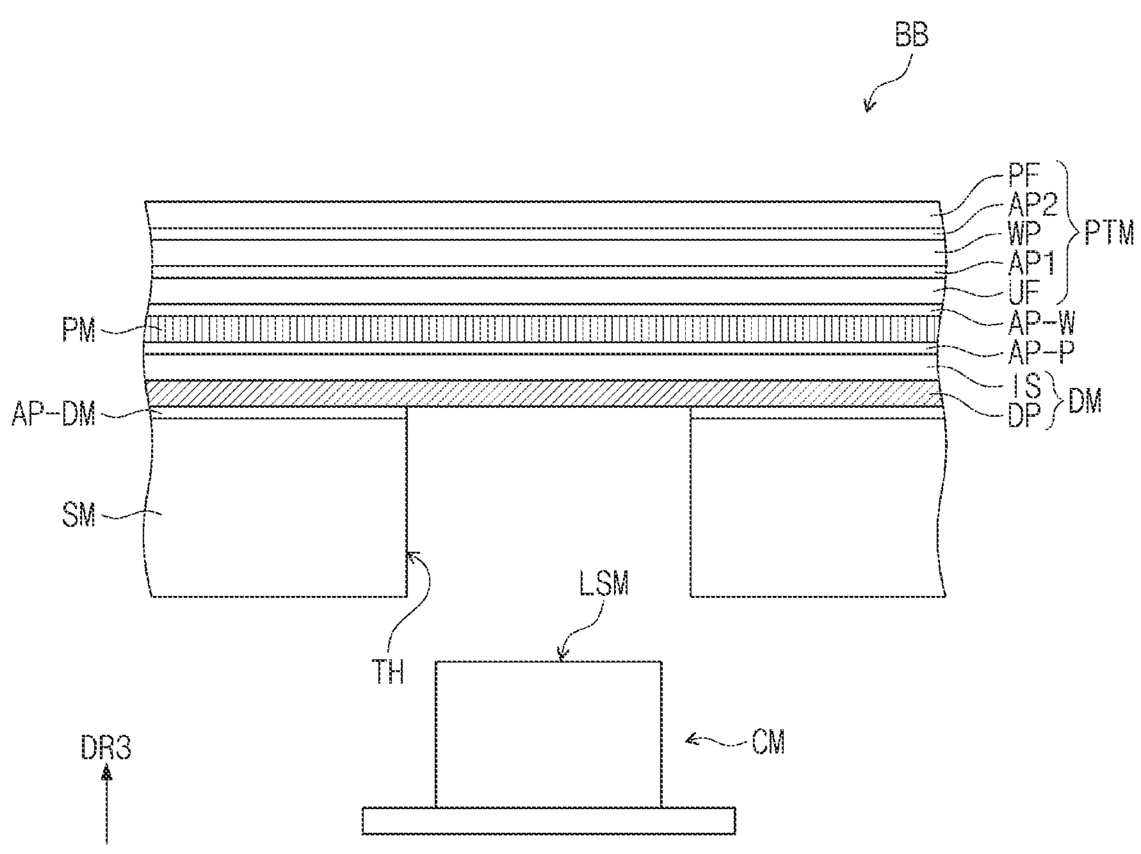
FIG. 5 is a schematic cross-sectional view showing a portion of an electronic device according to an embodiment.

FIG. 3 is an exploded schematic perspective view of an electronic device according to an embodiment, and FIG. 4 is a schematic cross-sectional view of an electronic device according to an embodiment. FIG. 5 is a schematic cross-sectional view showing a portion of an electronic device according to an embodiment in more detail. FIG. 3 illustrates an exploded schematic perspective of an electronic device according to an embodiment illustrated in FIG. 2A. FIG. 4 is a schematic cross-sectional view showing a portion corresponding to line I-I' of FIG. 3. FIG. 5 is a schematic cross-sectional view showing region BB of FIG. 4, and schematically illustrates the configuration of a support module in FIG. 4.

Referring FIG. 3 and FIG. 4, the electronic device ED of an embodiment may include the electronic module CM, a display module DM, and an optical member OM. The optical member OM may include a polarizing plate PM and an upper module PTM. The electronic device ED of an embodiment may include a support module SM disposed in a lower portion of the display module DM.

The display module DM may be disposed under the window module WM. The display module DM may be a component generating a video and sensing an input applied from the outside. The electronic module CM may be disposed under the display module DM, and may be, for example, a camera module. The display module DM may be also referred to as a first electronic module, and the electronic module CM may be also referred to as a second electronic module.

The display module DM may display a video according to an electrical signal, and may transmit/receive information about an external input. Referring to FIG. 3, the display module DM may include a display region AA and a non-display region NAA. The display region AA may be defined as a region that emits a video supplied by the display module DM.

The non-display region NAA is adjacent to the display region AA. In an embodiment, the non-display region NAA may surround the display region AA, for example. However, this is merely an illustrative embodiment, and the non-display region NAA may be defined in various shapes, and the disclosure is not limited thereto. In an embodiment, the display region AA of the display module DM may correspond to at least a part of the active region F-AA (refer to FIG. 2).

The display region AA of the display module DM may include a first display region DP-SA overlapping the electronic module CM and a second display region DP-NSA not overlapping the electronic module CM. In an embodiment, one region of the display module DM may have a higher transmittance than another region. In an embodiment, the first display region DP-SA overlapping the electronic module CM may have a higher transmittance than that of the second display region DP-NSA not overlapping the electronic module CM, for example. The first display region DP-SA may display a video, and may transmit an external input supplied to the electronic module CM, and/or an output from the electronic module CM. The first display region DP-SA may be a part of the display region AA, and may be also referred to as a sensing region. The first display region DP-SA may correspond to the sensing region SA of the electronic device ED.

In the electronic device ED of an embodiment, the optical member OM may have an in-plane retardation value in a range of about 50 nm to about 60 nm, and a thickness-direction retardation value in a range of about 50 nm to about 150 nm. In the electronic device ED of an embodiment, the upper module PTM may have an in-plane retardation value in a range of about 50 nm to about 60 nm, and a thickness-direction retardation value in a range of about 50 nm to about 150 nm.

For example, in the electronic device ED of an embodiment, functional layers included in the optical member OM may each have an in-plane retardation value in a range of about 50 nm to about 60 nm, and a thickness-direction retardation value in a range of about 50 nm to about 150 nm, and the entire optical member OM including functional layers may have an in-plane retardation value in a range of about 50 nm to about 60 nm, and a thickness-direction retardation value in a range of about 50 nm to about 150 nm.

The electronic device ED of an embodiment may solve problems such as non-uniformity of colors caused by the retardation in the optical member OM and non-uniformity of capturing quality according to a viewing angle by controlling the in-plane retardation of the optical member OM disposed in an upper portion of the display module DM to be in the range of about 50 nm to about 60 nm and at the same time, controlling the thickness-direction retardation thereof to be in the range of about 50 nm to about 150 nm.

In the disclosure, in-plane retardation $R_o$ may be represented by Equation 1 below.

$$R_o=\{|n_x-n_y|\}\times d \quad \text{[Equation 1]}$$

Thickness-direction retardation $R_{th}$ may be represented by Equation 2 below.

$$R_{th}=\{(|n_x-n_y|/2)-n_z\}\times d \quad \text{[Equation 2]}$$

In Equation 1 and Equation 2, $n_x$ is a refractive index in one axis (x-axis) direction in a plane of a layer or film, $n_y$ is a refractive index in the other axis (y axis) direction perpendicular to the one axis in the plane of the layer or film, $n_z$ is a refractive index in a z axis direction, which is a thickness direction, and d corresponds to the thickness of the layer or film. A retardation value may represent a value at a specific wavelength, and for example, the retardation value herein may be a value at a wavelength of about 550 nm.

FIG. 5 shows a portion corresponding to region BB of FIG. 4, and FIG. 5 is a schematic cross-sectional view of a portion of an electronic device according to an embodiment. Referring to FIG. 5, the upper module PTM may include a window WP and a protective layer PF disposed on an upper side of the window WP. The window WP is disposed on an upper side of the polarizing plate PM, and a window adhesive layer AP-W may be further disposed between the polarizing plate PM and the window WP.

The display module DM may be disposed on a lower side of the window WP. The window WP may cover the entire upper surface of the display module DM. The window WP may have a shape corresponding to or substantially corresponding to the shape of the display module DM.

The window WP may include an optically transparent insulation material. The window WP may be a glass substrate or a polymer substrate. For example, the window WP may be an enhanced tempered glass substrate. For example, the window WP may have a thickness thin enough to enable a folding operation. The window WP may be an ultra thin glass (UTG) substrate. The window WP may be made of a glass material, and used as a cover window in an electronic device.

The protective layer PF may be disposed in an upper portion of the window WP. The protective layer PF may be a functional layer which protects an upper surface of the window WP.

In an embodiment, the protective layer PF may have an in-plane retardation value in a range of about 50 nm to about 60 nm, and a thickness-direction retardation value in a range of about 50 nm to about 150 nm. In an embodiment, the protective layer PF may be a biaxially stretched polymer film.

The protective layer PF according to an embodiment may be a polymer film including at least one polymer resin of polyethyleneterephthalte (PET), poly(butylene terephthalate) (PBT), polyethylene naphthalene (PEN), polycarbonate (PC), poly(methylmethacrylate) (PMMA), polystyrene (PS), triacetyl cellulose (TAC), polyvinylchloride (PVC), polyethersulfone (PES), polypropylene (PP), polyamide (PA), modified polyphenylene ether (m-PPO), polyoxymethylene (POM), polysulfone (PSU), polyphenylene sulfide (PPS), polyimide (PI), polyethyleneimine (PEI), polyether ether ketone (PEEK), polyamide imide (PAI), polyarylate (PAR), or thermoplasitc polyurethane (TPU).

For example, in an embodiment, the protective layer PF may be a film including polyethylene terephthalate (PET), polycarbonate (PC), polymethyl methacrylate (PMMA), polystyrene (PS), or triacetyl cellulose (TAC). The protective layer PF may be a biaxially stretched polyethylene terephthalate (PET) film having an in-plane retardation value in a range of about 50 nm to about 60 nm, and a thickness-direction retardation value in a range of about 50 nm to about 150 nm.

In an embodiment, the protective layer PF may have a transmittance of about 85% or higher in a visible light region. For example, the protective layer PF may have a transmittance of about 90% or higher in a visible light region.

The upper module PTM may further include a protective layer adhesive layer AP2. The protective layer adhesive layer AP2 may be disposed between the window WP and the protective layer PF. By the protective layer adhesive layer AP2, the protective layer PF may be attached on the window WP. The protective layer adhesive layer AP2 may include a silicon-based resin, an acrylic resin, or a urethane-based resin. The protective layer PF may further include a material such as an anti-fingerprint coating agent, an anti-static agent, and a hard coating agent to serve as a functional layer. The protective layer PF may have a multi-layered stacking structure, and may further include a separate functional layer such as an anti-fingerprint coating layer, an anti-static coating layer, and a hard coating layer. For example, in case that the protective layer PF has a multi-layered stacking structure, functional layers constituting the protective layer PF may each have an in-plane retardation value in a range of about 50 nm to about 60 nm, and a thickness-direction retardation value in a range of about 50 nm to about 150 nm, and the entire protective layer PF provided by stacking functional layers may have an in-plane retardation value in a range of about 50 nm to about 60 nm, and a thickness-direction retardation value in a range of about 50 nm to about 150 nm.

The electronic device ED of an embodiment may include the protective layer PF disposed on an upper side of the polarizing plate PM and having an in-plane retardation value in a range of about 50 nm to about 60 nm, and a thickness-direction retardation value in a range of about 50 nm to about 150 nm, and thus, may improve the quality of an image captured by transmitting the display module DM using the electronic module CM disposed on a lower side of the display module DM. For example, the electronic device ED of an embodiment may include the upper module PTM including a polymer film having an in-plane retardation value in a range of about 50 nm to about 60 nm, and a thickness-direction retardation value in a range of about 50 nm to about 150 nm, and thus, may exhibit good display quality, and may solve the problem of stains of an image captured by transmitting the display module DM using the electronic module CM disposed on a lower side of the display module DM.

Referring to FIG. 5, in the electronic device ED according to an embodiment, the optical member OM may further include an upper film layer UF. However, unlike what is illustrated, in an embodiment, the upper film layer UF may be omitted.

In an embodiment, in case that the optical member OM may include the upper film layer UF, the upper film layer UF may be disposed in an upper portion of the polarizing plate PM. The upper film layer UF may be disposed between the polarizing plate PM and the window WP. The upper film layer UF may be disposed in an upper portion of the display module DM to protect the display module DM. The upper film layer UF may serve as an impact absorbing layer or an impact mitigating layer.

In an embodiment, the upper film layer UF may have an in-plane retardation value in a range of about 50 nm to about 60 nm, and a thickness-direction retardation value in a range of about 50 nm to about 150 nm. In an embodiment, the upper film layer UF may be a biaxially stretched polymer film.

In an embodiment, the base film may include at least one polymer resin among polyethyleneterephthalte (PET), poly (butylene terephthalate) (PBT), polyethylene naphthalene (PEN), polycarbonate (PC), poly(methylmethacrylate (PMMA), polystyrene (PS), polyvinylchloride (PVC), polyethersulfone (PES), polypropylene (PP), polyamide (PA), modified polyphenylene ether (m-PPO), polyoxymethylene (POM), polysulfone (PSU), polyphenylene sulfide (PPS), poluimide (PI), polyethyleneimine (PEI), polyether ether ketone (PEEK), polyamide imide (PAI), polyarylate (PAR), or thermoplasitc polyurethane (TPU).

For example, in an embodiment, the upper film layer UF may be a film including polyethylene terephthalate (PET), polycarbonate (PC), polymethyl methacrylate (PMMA), polystyrene (PS), or triacetyl cellulose (TAC). By way of example, the upper film layer UF may be a polyethylene terephthalate (PET) film or a polyimide (PI) film. The upper film layer UF may be a biaxially stretched polyethylene terephthalate (PET) film or a biaxially stretched polyimide (PI) film having an in-plane retardation value in a range of about 50 nm to about 60 nm, and a thickness-direction retardation value in a range of about 50 nm to about 150 nm.

In an embodiment, the upper film layer UF may have a transmittance of about 85% or higher in a visible light region. For example, the upper film layer UF may have a transmittance of about 90% or higher in a visible light region.

The optical member OM according to an embodiment may include the window adhesive layer AP-W. The window adhesive layer AP-W may be an optically clear adhesive film (OCA) or an optically clear adhesive resin layer (OCR).

Referring FIG. 4 and FIG. 5, the electronic device ED of an embodiment may further include an adhesive layer AP-P disposed between the display module DM and the polarizing plate PM. The adhesive layer AP-P may be an optically clear adhesive film (OCA) or an optically clear adhesive resin layer (OCR). However, the embodiment of the disclosure is not limited thereto, and the adhesive layer AP-P disposed between the display module DM and the polarizing plate PM may be omitted.

In an embodiment, the upper module PTM may further include a film adhesive layer AP1 disposed between the window WP and the upper film layer UF. The film adhesive layer AP1 may be an optically clear adhesive film (OCA) or an optically clear adhesive resin layer (OCR). However, the embodiment of the disclosure is not limited thereto.

The electronic device ED according to an embodiment may include a support module SM disposed in a lower portion of the display module DM. The support module SM may include a support plate MP and a lower support member BSM.

The support plate MP may be disposed on a lower side of the display module DM. In an embodiment, the support plate MP may include a metal material or a polymer material. For example, the support plate MP may be formed of including stainless steel, aluminum, or an alloy thereof. The support plate MP may be formed of carbon fiber reinforced plastic (CFRP) or the like within the spirit and the scope of the disclosure. However, the embodiment of the disclosure is not limited thereto, and the support plate MP may include a non-metal material, plastic, glass finer reinforced plastic, or glass.

The support plate MP may have openings OP defined thereon. The support plate MP may include an opening pattern OP-PT including the openings OP. The opening pattern OP-PT may be defined corresponding to the folding region FA.

The lower support member BSM may include a support member SPM and a filler SAP. The support member SPM may be a portion overlapping most regions of the display module DM. The filler SAP may be a portion disposed on the outside of the support member SPM and overlapping the outer periphery of the display module DM.

The lower support member BSM may include at least one of a support layer SP, a cushion layer CP, a shielding layer EMP, or an interlayer bonding layer ILP. The configuration of the lower support member BSM is not limited to what is illustrated in FIG. 4 and the like, and the configuration of the lower support member BSM may be changed depending on the size, shape, operation properties, or the like of the electronic device ED. For example, some of the support layer SP, the cushion layer CP, the shielding layer EMP, and the interlayer bonding layer ILP may be omitted, or the stacking order thereof may be changed to an order different from that of FIG. 3, or additional components other than the illustrated components may be further included. For example, the lower support member BMS may further include a digitizer and the like within the spirit and the scope of the disclosure.

The support layer SP may include a metal material or a polymer material. The support layer SP may be disposed on a lower side of the support plate MP. For example, the support layer SP may be a thin metal substrate.

The support layer SP may include a first sub-support layer SSP1 and a second sub-support layer SSP2 spaced apart from each other in the second direction axis DR2 direction. The first sub-support layer SSP1 and the second sub-support layer SSP2 may be spaced apart from each other on the basis of a portion corresponding to the folding axis FX. Since the support layer SP is provided as the first sub-support layer SSP1 and the second sub-support layer SSP2 spaced apart from each other in the folding region FA, the folding or bending properties of the electronic device ED may be improved.

The cushion layer CP may be disposed on a lower side of the support layer SP. The cushion layer CP may prevent pressing or plastic deformation of the support plate MP caused by external impact or force. The cushion layer CP may improve impact resistance properties of the electronic device ED. The cushion layer CP may include an elastomer such as sponge, foam, or a urethane resin. The cushion layer CP may be formed by including at least one of an acrylic polymer, a urethane-based polymer, a silicon-based polymer, or an imide-based polymer. However, the embodiment of the disclosure is not limited thereto.

The cushion layer CP may include a first sub-cushion layer CP1 and a second sub-cushion layer CP2 spaced apart from each other in the second direction axis DR2 direction. The first sub-cushion layer CP1 and the second sub-cushion layer CP2 may be spaced apart from each other in a portion corresponding to the folding axis FX. Since the cushion layer CP is provided as the first sub-cushion layer CP1 and the second sub-cushion layer CP2 spaced apart from each other in the folding region FA, the folding or bending properties of the electronic device ED may be improved.

The shielding layer EMP may be an electromagnetic wave shielding layer or a heat dissipating layer. The shielding layer EMP may serve as a bonding layer. The interlayer bonding layer ILP may bond the support plate MP and the lower support member BSM. The interlayer bonding layer ILP may be provided in the form of a bonding resin layer or an adhesive tape. In FIG. 4, the interlayer bonding layer ILP is illustrated as being divided into two portions spaced apart from each other in a portion corresponding to the folding region FA, but the embodiment of the disclosure is not limited thereto, and the interlayer bonding layer ILP may be divided as one layer or a layer not spaced apart from each other in the folding region FA.

The filler SAP may be disposed at the outer periphery of the support layer SP and the cushion layer CP. The filler SAP may be disposed between the support plate MP and a housing HAU. The filler SAP may fill a space between the support plate MP and the housing HAU, and may fix the support plate MP.

The electronic device ED of an embodiment may further include a module adhesive layer AP-DM disposed between the display module DM and the support module SM. The module adhesive layer AP-DM may be an optically clear adhesive film (OCA) or an optically clear adhesive resin layer (OCR). Although not illustrated, an adhesive layer may be further disposed between members included in the support module SM.

The support module SM may have a through-hole TH defined therein. The through-hole TH may overlap or correspond to the sensing region SA (see FIG. 2A) of the electronic device ED. The through-hole TH may be defined overlapping the electronic module CM. At least a portion of the electronic module CM may be inserted into the through-hole TH.

In an embodiment, the electronic module CM may be a camera module. The camera module may capture a still image or a moving image. The camera module may be provided in plurality. At least some or a number of the camera modules may overlap a first display region DP-SA of the display module DM. An external input (for example, light) may be provided to the camera module through the first display region DP-SA. For example, the camera module may capture an external image by receiving natural light through the first display region DP-SA. The electronic module CM may also include a non display region DP-NSA.

In an embodiment, the electronic module CM may be a camera module disposed on a lower side of the display module DM to capture an image in a front surface direction of the display module DM. For example, a lens surface LSM of the electronic module CM may be toward a display module DM direction.

The electronic device ED may include the housing HAU which accommodates the electronic module CM, the display module DM, the support module SM, and the like within the spirit and the scope of the disclosure. The housing HAU may be coupled or connected to the upper module PTM. Although not illustrated, the housing HAU may further include a hinge structure for facilitating folding or bending.

The optical member OM according to an embodiment may include the polarizing plate PM disposed on the display module DM. The polarizing plate PM may be disposed in an upper portion of the display module DM to control reflective light in the display module DM caused by external light. For example, the polarizing plate PM may reduce the reflectance caused by external light incident from the outside of the display module DM. The polarizing plate PM may be a circular polarizer which circularly polarizes incident light. However, the embodiment of the disclosure is not limited thereto, and the polarizing plate PM may function as a linear polarizer.

In an embodiment, the polarizing plate PM may further include a polarizing protective layer. In an embodiment, the polarizing protective layer disposed in at least one of an upper portion and a lower portion of the polarizing plate PM may be a film having an in-plane retardation value in a range of about 50 nm to about 60 nm, and a thickness-direction retardation value in a range of about 50 nm to about 150 nm. For example, the polarizing protective layer may be a biaxially stretched polymer film satisfying the above-described retardation value range.

The electronic device ED of an embodiment controls the retardation value of polymer films included in the optical member OM disposed in an upper portion of the display module DM, and thus, may solve the problems of color stains and color difference according to a viewing angle of a captured image captured by transmitting the display module DM.

The electronic device ED according to an embodiment optimizes the in-plane retardation and thickness-direction retardation of each of the protective layer PF, the upper film layer UF, and the polarizing plate PM of the optical member OM disposed on the electronic module CM, and also, optimizes the in-plane retardation value of the entire optical member OM in a range of about 50 nm to about 60 nm, and the thickness-direction retardation value thereof in a range of about 50 nm to about 150 nm, and thus, may minimize optical interference caused in the optical member OM in case that the electronic module CM is used. For example, the electronic device ED of an embodiment controls the retardation value of each of functional layers disposed on an upper side of the display module DM and included in the optical member OM, and thus, may exhibit capturing quality in which problems of Rainbow mura phenomenon and the like caused by the functional layers are solved. In an electronic device according to an embodiment, film layers included in the protective layer PF, the upper film layer UF, and the polarizing plate PM of the optical member OM satisfying the above-described retardation value range may each be a biaxially stretched film.

Figure 7:
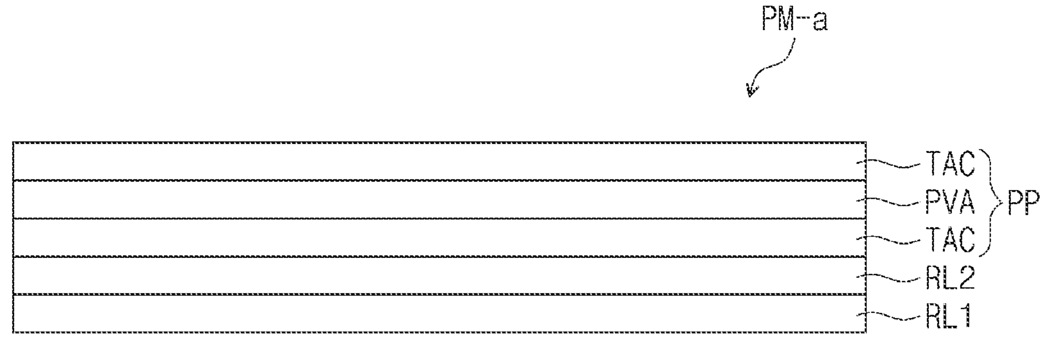
FIG. 7 is a schematic cross-sectional view of a polarizing plate according to an embodiment.
Figure 7:

FIG. 7 is a schematic cross-sectional view of a polarizing plate according to an embodiment. Referring to FIG. 7, a polarizing plate PM-a may include a linear polarizing layer PP and at least one of phase retardation layers RL1 and RL2.

In the polarizing plate PM-a, the linear polarizing layer PP may be an optical layer which linearly polarizes provided light in one direction or a direction. The linear polarizing layer PP may include a linear polarizer PVA of a film type including a stretched polymer film. For example, the linear polarizer PVA may include a stretched polyvinyl alcohol-based film.

The linear polarizing layer PP may be prepared by adsorbing a dichroic dye onto a stretched polymer film. For example, the linear polarizing layer PP may be prepared by adsorbing iodine onto a stretched polyvinyl alcohol film. At this time, a direction in which the polymer film is stretched may be an absorption axis of the linear polarizing layer PP, and a direction perpendicular to the direction in which the polymer film is stretched may be a transmission axis of the linear polarizing layer PP.

The linear polarizing layer PP may include the linear polarizer PVA and a polarizing protective layer TAC. The polarizing protective layer TAC may be disposed in at least one of an upper portion and a lower portion of the linear polarizer PVA. The polarizing protective layer TAC disposed in at least one of an upper portion and a lower portion of the linear polarizer PVA may be a film having an in-plane retardation value in a range of about 50 nm to about 60 nm, and a thickness-direction retardation value in a range of about 50 nm to about 150 nm. For example, each of the polarizing protective layers TAC disposed in an upper portion and a lower portion of the linear polarizer PVA may be a biaxially stretched polymer film satisfying the above-described retardation value range.

Figure 6:
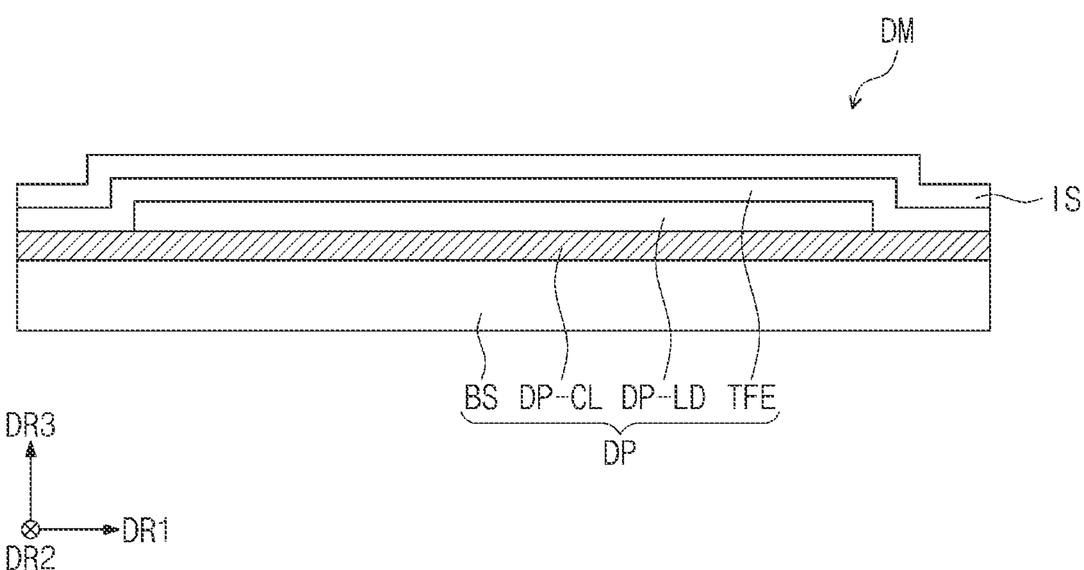
FIG. 6 is a schematic cross-sectional view of a display module according to an embodiment.

FIG. 6 is a schematic cross-sectional view of a display module according to an embodiment. Referring to FIG. 6, the display module DM may include a display panel DP and an input sensor IS.

The display panel DP may be a component that substantially generates an image. The display panel DP may be a light emitting display panel and may be, for example, an organic light emitting display panel, an inorganic light emitting display panel, a quantum dot display panel, a micro-LED display panel, or a nano-LED display panel. The display panel DP may be referred to as a display layer.

The display panel DP may include a base layer BS, a circuit layer DP-CL, a light emitting element layer DP-LD, and an encapsulation layer TFE.

The base layer BS may be a member providing a base surface on which the circuit layer DP-CL is disposed. The base layer BS may be a rigid substrate or a flexible substrate capable of bending, folding, or rolling. The base layer BS may be a glass substrate, a metal substrate, a polymer substrate, or the like within the spirit and the scope of the disclosure. However, an embodiment is not limited thereto, and the base layer BS may be an inorganic layer, an organic layer, or a composite material layer. For example, in an embodiment, the base layer BS may include an organic layer formed of transparent polyimide.

The base layer BS may have a multilayer structure. For example, the base layer BS may include a first synthetic resin layer, an intermediate layer having a multilayer or single-layer structure, and a second synthetic resin layer disposed on the intermediate layer. The intermediate layer may be referred to as a base barrier layer. The intermediate layer may include a silicon oxide ($SiO_x$) layer and an amorphous silicon (a-Si) layer disposed on the silicon oxide layer, but an embodiment is not limited thereto. For example, the intermediate layer may include at least one of a silicon oxide layer, a silicon nitride layer, a silicon oxynitride layer, or an amorphous silicon layer.

Each of the first and second synthetic resin layers may include polyimide-based resin. Each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. In this specification, "..."-based resin means that the "..."-based resin includes a functional group of "...". The polyimide-based resin may be transparent polyimide-based resin.

The circuit layer DP-CL may be disposed on the base layer BS. The circuit layer DP-CL may include an insulating layer, a semiconductor pattern, a conductive pattern, a signal line, and the like within the spirit and the scope of the disclosure. The insulating layer, a semiconductor layer, and a conductive layer may be formed on the base layer BS in a method such as coating and deposition, and thereafter, the insulating layer, the semiconductor layer, and the conductive layer may be selectively patterned through a number of times of a photolithography process. Thereafter, the semiconductor pattern, the conductive pattern, and the signal line included in the circuit layer DP-CL may be formed.

The light emitting element layer DP-LD may be disposed on the circuit layer DP-CL. The light emitting element layer DP-LD may include a light emitting element. For example, the light emitting element layer DP-LD may include an organic light emitting material, an inorganic light emitting material, an organic-inorganic light emitting material, a quantum dot, a quantum rod, a micro-LED, or a nano-LED.

The encapsulation layer TFE may be disposed on the light emitting element layer DP-LD. The encapsulation layer TFE may protect the light emitting element layer DP-LD from foreign matter such as moisture, oxygen, and dust particles.

The input sensor IS may be disposed on the display panel DP. The input sensor IS may sense an external input applied from the outside. The external input may be a user's input. The user's input may include various types of external inputs such as a part of a user's body, light, heat, a pen, and pressure.

In the display module DM according to an embodiment, the input sensor IS may be formed on the display panel DP through a continuous process. The input sensor IS may be said to be disposed on or directly disposed on the display panel DP. The expression "directly disposed" may mean that a third component is not disposed between the input sensor IS and the display panel DP. For example, a separate adhesive member may not be disposed between the input sensor IS and the display panel DP. For example, in an embodiment, the input sensor IS may be bonded to display panel DP by an adhesive member. The adhesive member may include an adhesive or a detachable adhesive.

Referring to FIG. 7, the polarizing plate PM-a may include a first phase retardation layer RL1 disposed in a lower portion of the linear polarizing layer PP. In an embodiment, the polarizing plate PM-a may further include a second phase retardation layer RL2 disposed between the first phase retardation layer RL1 and the linear polarizing layer PP.

Each of the first phase retardation layer RL1 and the second phase retardation layer RL2 may be an optical layer which delays the phase of provided light. The first phase retardation layer RL1 may be a $\lambda/4$ phase retardation layer, and the second phase retardation layer RL2 may be a $\lambda/2$ phase retardation layer.

For example, in an embodiment, the polarizing plate PM-a may include the linear polarizing layer PP and the $\lambda/4$ phase retardation layer, or the polarizing plate PM-a may include the linear polarizing layer PP, the $\lambda/2$ phase retardation layer, and the $\lambda/4$ phase retardation layer.

The second phase retardation layer RL2 may be an optical layer which delays the phase of provided light by $\lambda/2$. The second phase retardation layer RL2 may change the polarization state of incident light. The polarization direction of linearly polarized light incident from the linear polarizing layer PP on the second phase retardation layer RL2 may be changed.

The first phase retardation layer RL1 has optical anisotropy, and may change the polarization state of light incident on the first phase retardation layer RL1. For example, light provided to the first phase retardation layer RL1 by transmitting the linear polarizing layer PP may be changed from being in a linearly polarized state to being in a circularly polarized state. Light provided to the first phase retardation layer RL1 in a circularly polarized state may be changed to being in a linearly polarized state.

Figure 8:
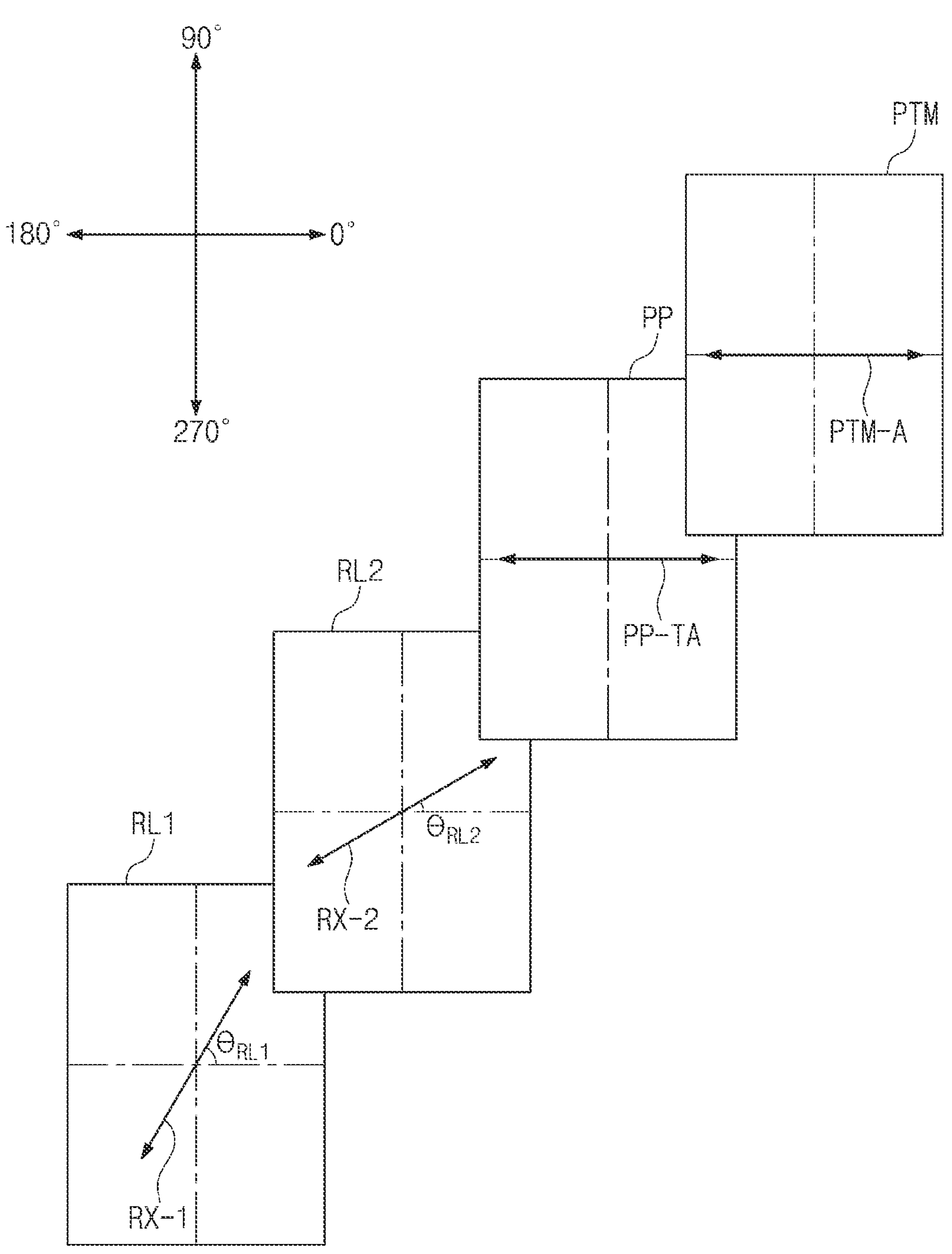
FIG. 8 is an image showing the relationship of optical axes in an electronic device according to an embodiment.

FIG. 8 is a view schematically illustrating the optical axis relationship of functional layers in an electronic device according to an embodiment. In case that the direction of a transmission axis PP-TA of the linear polarizing layer PP is set to 0° and 180°, the direction of a first optical axis PTM-A of the upper module PTM disposed in an upper portion of the linear polarizing layer PP may be parallel to a transmission axis PP-TA of the linear polarizing layer PP. At this time, the first optical axis PTM-A of the upper module PTM may be a slow axis direction in the biaxially stretched protective layer PF (see FIG. 5). In an embodiment, the first optical axis PTM-A of the upper module PTM may be a slow axis direction in the biaxially stretched upper film layer UF (see FIG. 5). For example, in an embodiment, the transmission axis PP-TA of the linear polarizing layer PP and the optical axis of the protective layer PF or the upper film layer UF included in the upper module PTM may be parallel.

An angle $\theta_{RL1}$ formed between a second optical axis RX-1 of the first phase retardation layer RL1 and the transmission axis PP-TA of the linear polarizing layer PP may be about 75±5°, and an angle $\theta_{RL2}$ formed between a third optical axis RX-2 of the second phase retardation layer RL2 and the transmission axis PP-TA of the linear polarizing layer PP may be about 15±5°. In case that the second phase retardation layer RL2 is omitted, the angle $\theta_{RL1}$ formed between the transmission axis PP-TA of the linear polarizing layer PP and the second optical axis RX-1 of the first phase retardation layer RL1 may be about 45±5°. However, the embodiment of the disclosure is not limited thereto, and the disposition of functional layers may be changed according to the quality of an image required by an electronic device.

The transmission axis PP-TA of the linear polarizing layer PP, the first optical axis PTM-A of the upper module PTM, the second optical axis RX-1 of the first phase retardation layer RL1, and the third optical axis RX-2 of the second phase retardation layer RL2 illustrated in FIG. 8 show the relative disposition relationship of optical axes, and the direction of each of the optical axes are not limited to what is illustrated in FIG. 8. For example, in case that viewed from the display surface FS of the electronic device ED (see FIG. 2A), the transmission axis PP-TA of the linear polarizing layer PP may be parallel to the first direction axis DR1, or may be parallel to the second direction axis DR2. For example, the transmission axis PP-TA of the linear polarizing layer PP may be in the 0° or 90° direction. However, the embodiment of the disclosure is not limited thereto, and the transmission axis PP-TA of the linear polarizing layer PP may be in the 45° direction. Even in case that the transmission axis PP-TA of the linear polarizing layer PP is in the 45° direction, an angle formed between the transmission axis PP-TA of the linear polarizing layer PP and the optical axes of the protective layer PF, the first phase retardation layer RL1, and the second phase retardation layer RL2 may be defined as described above.

Figure 9:
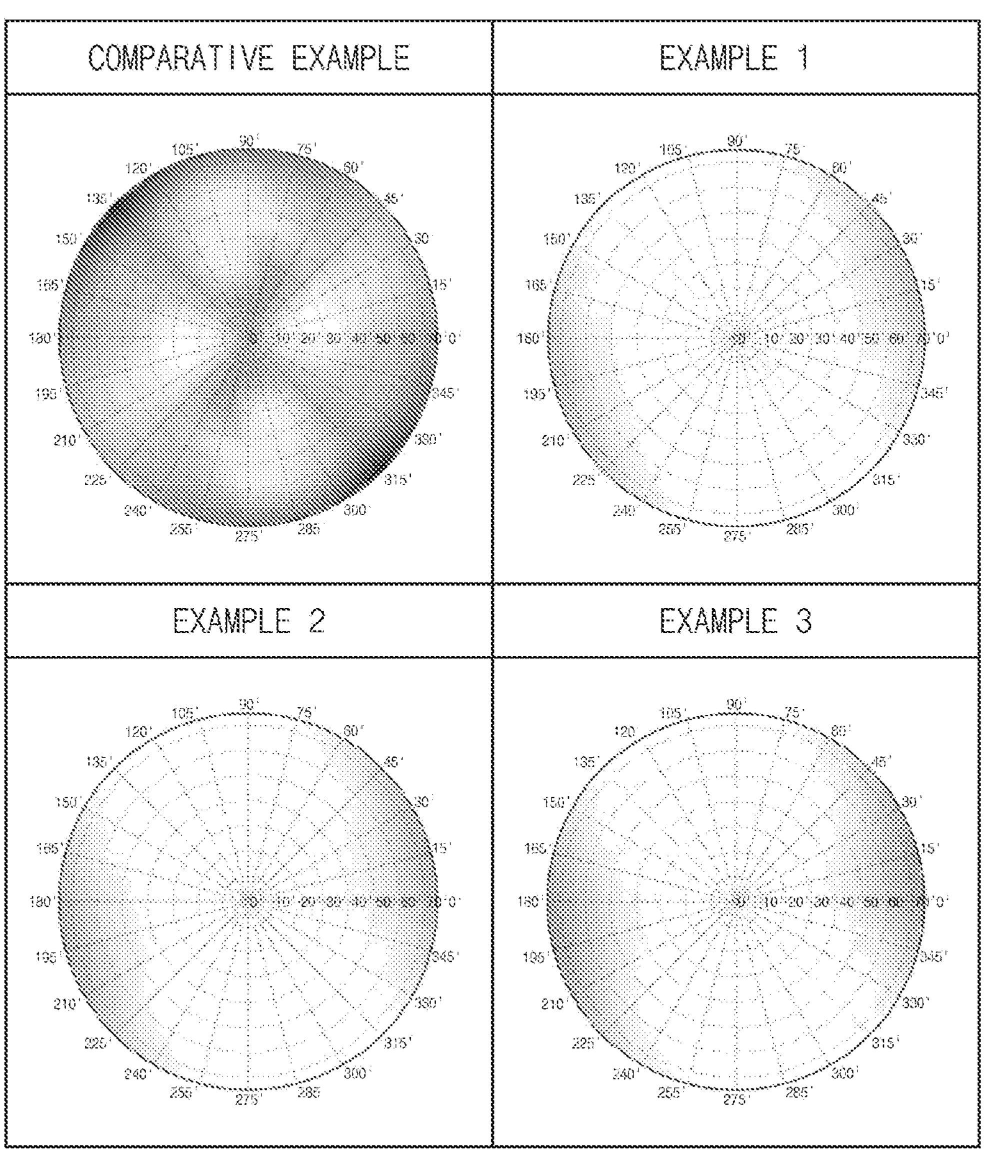
FIG. 9 and FIG. 10 are images showing evaluation results of the quality of images captured using electronic modules in case that electronic devices of Comparative Examples and Examples are used, respectively.
Figure 10:
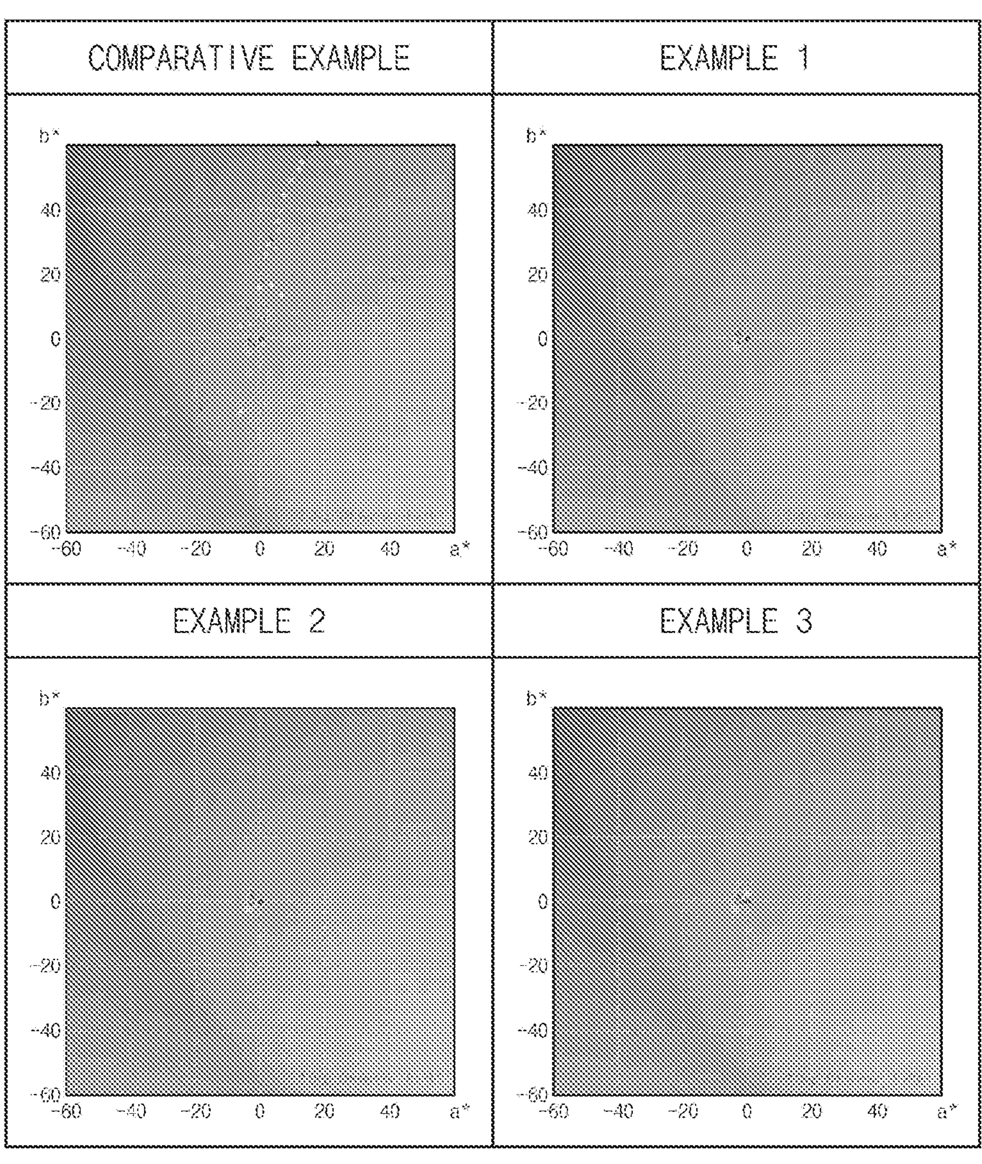

FIG. 9 and FIG. 10 are views showing the comparison of the quality of images captured using electronic devices of Comparative Examples and Examples, respectively.

In Comparative Examples and Examples evaluated in FIG. 9 and FIG. 10, Comparative Examples correspond to a case in which an optical functional layer disposed on a polarizing plate has an in-plane retardation value of about 300 nm, and a thickness-direction retardation value of about 1000 nm. In comparison, Example 1 corresponds to a case in which an optical functional layer disposed on a polarizing plate has an in-plane retardation value and a thickness-direction retardation value of about 50 nm each, Example 2 corresponds to a case in which an optical functional layer disposed on a polarizing plate has an in-plane retardation value of about 50 nm and a thickness-direction retardation value of about 100 nm, and Example 3 corresponds to a case in which an optical functional layer disposed on a polarizing plate has an in-plane retardation value of about 50 nm and a thickness-direction retardation value of about 150 nm.

FIG. 9 shows color change and luminance change according to a viewing angle in Comparative Examples and Examples. FIG. 10 shows the distribution of color coordinates in Comparative Examples and Examples.

Referring to FIG. 9, in the cases of Example 1 to Example 3 including an optical functional layer whose in-plane retardation value is controlled to be in a range of about 50 nm to about 60 nm and whose thickness-direction retardation value is controlled to be in a range of about 50 nm to about 150 nm, it can be seen that the luminance and color uniformity according to a viewing angle are improved compared to Comparative Examples. In the cases of Comparative Examples, it can be seen that the color non-uniformity according to a viewing angle is large.

Referring to FIG. 10, in the cases of Example 1 to Example 3 including an optical functional layer whose in-plane retardation value is controlled to be in a range of about 50 nm to about 60 nm and whose thickness-direction retardation value is controlled to be in a range of about 50 nm to about 150 nm, it can be seen that the degree of dispersion of color coordinates is small compared to that of Comparative Examples. For example, Examples including optical functional layers whose in-plane retardation value and thickness-direction retardation value are controlled to be in ranges exhibit uniform color coordinate values, and thus, it can be seen that the problem of non-uniform capturing quality is solved.

Referring to the evaluation results of FIG. 9 and FIG. 10, in case that a functional layer disposed on a polarizing plate has an in-plane retardation value in a range of about 50 nm to about 60 nm and a thickness-direction retardation value in a range of about 50 nm to about 150 nm, it can be seen that the problem of stains of a captured image or image is solved compared to Comparative Examples which are out of the above retardation value range.

An electronic device of an embodiment may include an electronic module, a display module including a display region overlapping the electronic module, and an optical member, wherein the in-plane retardation value of the optical member in an upper portion of the display module is controlled to be in a range of about 50 nm to about 60 nm, and the thickness-direction retardation value thereof is controlled to be in a range of about 50 nm to about 150 nm, and thus, may be characterized in that problems of the degradation in display quality due to light interference, light scattering, and the like of optical functional layers, the degradation in sensitivity properties of the electronic module, and stains of an image captured by a camera module, which is the electronic module, are solved. An electronic device of an embodiment may include a camera module as an electronic module, and may include a display module including a display region that displays an image in a portion overlapping the camera module, a polarizing plate disposed on the display module, and an upper module disposed in an upper portion of the polarizing plate, wherein the in-plane retardation value of at least one polymer film including in the upper module is controlled to be in a range of about 50 nm to about 60 nm, and the thickness-direction retardation value thereof is controlled to be in a range of about 50 nm to about 150 nm, and thus, may exhibit excellent capturing quality even in case that the display module and the like are disposed on a path of light incident on the electronic module or emitted from the electronic module.

An electronic device of an embodiment may exhibit an effect of solving the problem of performance degradation of an electronic module disposed on a lower side of a display module by controlling a retardation value in an optical member disposed in an upper portion of the display module.

An electronic device of an embodiment may solve the problem of stains of an image captured by a camera module disposed on a lower side of a display module and overlapping an active region by controlling a retardation value in an optical member disposed in an upper portion of the display module.

Although the disclosure has been described with reference to embodiments of the disclosure, it will be understood by those skilled in the art that various modifications and changes in form and details may be made therein without departing from the spirit and scope of the disclosure as set forth in the following claims.

Accordingly, the technical scope of the disclosure is not intended to be limited to the contents set forth in the detailed description of the specification, but is also intended to be defined by the appended claims.

What is claimed is:

1. An electronic device comprising:

an electronic module;

a display module including a first display region overlapping the electronic module in a plan view and a second display region not overlapping the electronic module in the plan view;

a polarizing plate disposed on the display module, wherein the polarizing plate comprises a linear polarizing layer and the linear polarizing layer comprises a linear polarizer, at least one polarizing protective layer is disposed on the linear polarizer, and the at least one polarizing protective layer has an in-plane retardation value in a range of about 50 nm to about 60 nm, and a thickness-direction retardation value in a range of about 50 nm to about 150 nm; and an upper module disposed on the polarizing plate, having an in-plane retardation value in a range of about 50 nm to about 60 nm, and having a thickness-direction retardation value in a range of about 50 nm to about 150 nm.

2. The electronic device of claim 1, wherein the upper module comprises a window disposed on an upper side of the polarizing plate, and a protective layer disposed on the window, and the protective layer has an in-plane retardation value in a range of about 50 nm to about 60 nm, and a thickness-direction retardation value in a range of about 50 nm to about 150 nm.

3. The electronic device of claim 2, wherein the protective layer is a biaxially stretched polymer film.

4. The electronic device of claim 3, wherein the protective layer comprises polyethylene terephthalate (PET), polycarbonate (PC), polymethyl methacrylate (PMMA), polystyrene (PS), or triacetyl cellulose (TAC).

5. The electronic device of claim 2, wherein the polarizing plate comprises a linear polarizing layer, a transmission axis of the linear polarizing layer and a slow axis of the protective layer are parallel.

6. The electronic device of claim 2, wherein the window is a tempered glass substrate.

7. The electronic device of claim 2, wherein the upper module comprises an upper film layer disposed between the polarizing plate and the window, and the upper film layer has an in-plane retardation value in a range of about 50 nm to about 60 nm, and a thickness-direction retardation value in a range of about 50 nm to about 150 nm.

8. The electronic device of claim 7, wherein the upper film layer is a biaxially stretched polymer film.

9. The electronic device of claim 8, wherein the upper layer comprises polyethylene terephthalate (PET), polycarbonate (PC), polymethyl methacrylate (PMMA), polystyrene (PS), or triacetyl cellulose (TAC).

10. The electronic device of claim 7, wherein the polarizing plate comprises a linear polarizing layer, and a transmission axis of the linear polarizing layer and a slow axis of the upper layer are parallel.

11. The electronic device of claim 1, wherein the polarizing plate comprises a λ/4 phase retardation layer disposed between the display module and the linear polarizing layer.

12. The electronic device of claim 1, wherein the electronic module is a camera module with an optical path disposed in a direction of the display module.

13. The electronic device of claim 1, wherein the display module comprises a display panel including a light emitting element layer, and an input sensor directly disposed on the display panel.

* * * * *